United States Patent
Faisy

(10) Patent No.: US 7,659,695 B2
(45) Date of Patent: Feb. 9, 2010

(54) DEHUMIDIFYING DEVICE FOR RECHARGEABLE ELECTRONIC EQUIPMENT

(75) Inventor: Christian Faisy, La Montagne (FR)

(73) Assignee: Societe Francaise du Radiotelephone, Paris (FR)

( * ) Notice: Subject to any disclaimer, the term of this patent is extended or adjusted under 35 U.S.C. 154(b) by 296 days.

(21) Appl. No.: 11/834,160

(22) Filed: Aug. 6, 2007

(65) Prior Publication Data

US 2008/0054844 A1    Mar. 6, 2008

(30) Foreign Application Priority Data

Sep. 5, 2006    (FR) .................................. 06 53581

(51) Int. Cl.
  *H02J 7/00*    (2006.01)
  *H02B 1/00*    (2006.01)
  *H05K 7/20*    (2006.01)
(52) U.S. Cl. ..................... 320/115; 320/107; 361/678; 361/690
(58) Field of Classification Search .................. 320/107, 320/114, 115; 361/678, 690
See application file for complete search history.

(56) References Cited

U.S. PATENT DOCUMENTS 6,362,594 B2 *    3/2002    Kajiura ....................... 320/104

2008/0211958 A1 *    9/2008    Berkey et al. ............... 348/373

FOREIGN PATENT DOCUMENTS

GB    2314920 A    1/1998
WO    2006058265 A2    6/2006

* cited by examiner

*Primary Examiner*—Edward Tso
*Assistant Examiner*—Richard V Muralidar
(74) *Attorney, Agent, or Firm*—Perman & Green LLP

(57) ABSTRACT

A device associates an enclosing capsule in which will be fitted electronic equipment requiring dehumidification, and a medium-to-low voltage converter to recharge electronic equipment. Heat energy released by the coil in the converter will lead to a free thermal exchange of air between the inside and the outside of the capsule, produced by the natural convection from vent holes located in the lower part of the device through which air will be sucked from the outside and vent holes located in the upper part of the device through which warm air thus produced will escape. The circulation of unsaturated warm air around the electronic equipment has the effect of removing the water molecules on the components by saturating the ambient air in the confinement zone, this air being evacuated through vent holes located in the upper part of the device.

8 Claims, 1 Drawing Sheet

DEHUMIDIFYING DEVICE FOR RECHARGEABLE ELECTRONIC EQUIPMENT

FIELD

The disclosed embodiments relate to a dehumidifying device for one or more items of rechargeable electronic equipment.

BRIEF DESCRIPTION OF RELATED DEVELOPMENTS

The domain of the invention is the maintenance in optimal working order of items of rechargeable electronic equipment, the use of which in conditions of high relative humidity can be detrimental to their performance. More specifically, the invention relates to the domain of electronic telecommunication equipment such as, for example, mobile terminals used by customers of a mobile telephony operator, such customers sometimes using the said mobile terminal in saturated atmospheric conditions (rain, fog, marine environment and more generally in a tropical climate).

It would be advantageous to extend the working life of the rechargeable electronic equipment when used in these environments with saturated atmospheric conditions.

In the background art it is recognized that the presence of humidity on the components of electronic equipment is conducive to corrosion. The daytime use of this equipment in conditions of relative humidity approaching saturation favors the infiltration of humidity in this equipment and the deposit of water molecules on the circuits and/or components of the said equipment. Some of these molecules are deposited on metallic parts forming circuits and/or electronic components, thus causing an oxidation of the said circuits or components. The oxidation of electronic circuits or components can thus be substantial and cause sometimes irreversible malfunctions.

In the background art it is recognized that the use of dehydrating agents, such as, for example, silica crystals, packaged in a porous sachet placed along with the electronic equipment requiring protection, in a confined environment, enables a reduction of this oxidation phenomenon. In addition to their impracticality and low level of efficiency in an environment that is unconfined or has a rate of relative humidity close to that which previously caused the deposit of the water molecules, these solutions present the main disadvantage of requiring regular changes of the dehydrator sachets, the latter becoming quickly saturated with water. The method is consequently largely unreliable and the effects of absorption of the water molecules are linked, on one hand, to the conditions in which the sachets are used and, on the other, to their state of use (new or saturated), the second state being irreversible.

Another solution in the background art consists of storing the electronic equipment in a room with constant, controlled relative humidity. However, by its very nature, mobile equipment must be constantly at hand for the user. The requirement to store it in such as specific environment would therefore be contrary to its original purpose. The disclosed embodiments improve the background art by taking advantage of the requirement to recharge items of electronic equipment (generally at night) thus guaranteeing their availability and operational independence (generally during the day). The charger generally supplied with this equipment is a medium-to-low voltage converter which innately produces heat energy capable of absorbing the humidity contained in the items of rechargeable electronic equipment, provided that the latter are placed, as set forth in the invention, with the charger in a confined environment through which a system of high and low vents enables air to circulate by thermal convection, thereby facilitating the evacuation of the humidity contained in the device to the exterior of the confined space as a result of the warm draft thus produced.

SUMMARY

The disclosed embodiments include a device associating a confined space capable of containing the rechargeable electronic equipment that requires dehumidifying, with a charger connected to the medium voltage (220V or 110V) power supply network by means of a power cable. The main function of the charger is of course here to convert a medium voltage to a low voltage thus recharging, as required, the rechargeable equipment placed in the enclosing capsule. The heat generated by the heating of the charger coil during the voltage conversion is used directly to dehumidify the rechargeable electronic equipment placed in the confined space. In the disclosed embodiments, the charger is placed in the lower part of an enclosing capsule into which it fits. The charger has vent holes drilled in the upper and lower parts enabling air to circulate freely by thermal convection when the charger releases heat energy produced by the component's coil. This effect occurs when the charging device is connected to the power supply network. In the upper part of the charger, a connector enables the rechargeable electronic equipment to be plugged into the charger. In the preferred embodiment, the enclosing capsule is made up of at least two mobile parts that open and close hermetically. These mobile parts enable the confinement mechanism to be opened so that the rechargeable electronic equipment can be placed on the charger, thereby enabling the battery in the said equipment to be recharged. The enclosing capsule in the hermetically closed position has vent holes on the upper and lower parts enabling air to circulate freely inside the capsule.

The disclosed embodiments thus relate to a dehumidifying device for rechargeable electronic equipment being comprised of:

a charger capable of accommodating the rechargeable electronic equipment to ensure the recharging of the said rechargeable electronic equipment, an enclosing capsule fixed to the charger, a system for opening the enclosing capsule enabling the installation of the rechargeable electronic equipment connected to the charger by means of an electrical connection, vent holes on the upper part of the enclosing capsule enabling warm air to leave the enclosing capsule, vent holes on the lower part of the enclosing capsule or the charger, the latter acting as a base on which the equipment can stand, enabling air from outside to enter and circulate within the enclosing capsule.

Thus, the dehumidifying device contains vent holes enabling the air to circulate freely inside the device, from bottom to top, the vent holes in the lower part of the device enabling the air to enter from the outside, on one hand, then to be sucked by convection (when the charger is connected to the source of medium voltage electrical power), leaving through the vent holes in the upper part of the dehumidifying device.

In an alternative embodiment, the area of the vent holes on the upper part of the enclosing capsule is smaller than the area of the vent holes on the lower part of the enclosing capsule or the charger.

This keeps the warm air in the enclosing capsule for a longer period than if the vent holes had the same area (in this case the air flow would be fluid rather than turbulent).

In an alternative embodiment, the enclosing capsule is made of a material that is heatproof and has isothermal properties.

Thus, the whole of the device is advantageously hermetic once the rechargeable electronic equipment has been placed inside for the charge/dehumidification sequence.

In an alternative embodiment, the enclosing capsule is translucent, enabling a user to see the mobile electronic equipment inserted in the said dehumidifying device.

In the preferred embodiment, the enclosing capsule is rigid.

In an alternative embodiment, the enclosing capsule is made of a flexible material forming at least one flexible membrane, the rigidity of the device being obtained by curved ribs or by the injection of air between the capsule membranes.

BRIEF DESCRIPTION OF THE DRAWINGS

The disclosed embodiments may best be understood by reference to the following detailed description taken in conjunction with the accompanying drawing. This drawing is provided as an indication only and in no way limits the scope of the invention.

DETAILED DESCRIPTION OF THE DISCLOSED EMBODIMENTS

Figure 1:
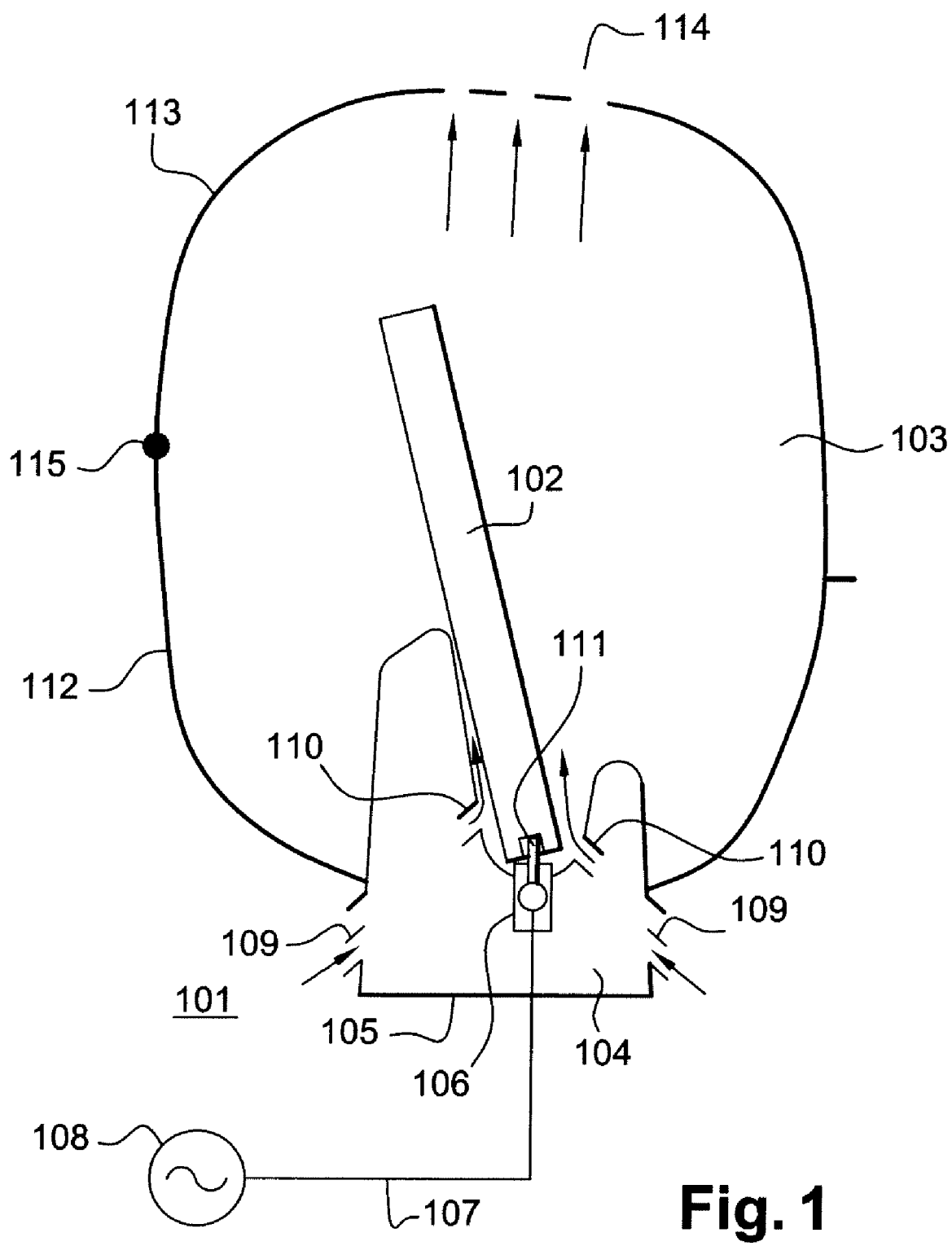
FIG. 1 shows a representation of the device as set forth in the invention.

Thus, FIG. 1 shows a dehumidifying device 101 to which is connected, in a preferred example of rechargeable electronic equipment, a mobile telephone 102. However, the disclosed embodiment is adaptable to all types of electronic equipment that must be recharged. A technician will understand easily that it will thus be sufficient to adapt the size of the enclosing capsule to the dimensions of the rechargeable electronic equipment.

The device 101 is made up of an enclosing capsule 103 which includes a charging device 104.

The charging device 104 is divided into two parts:

a base 105 capable of supporting an item of electronic equipment during recharging and a voltage converter 106 fixed to the base 105 connected to the electronic equipment in need of recharging, placed on the said support The converter 106 is also connected to a medium voltage power source 108 via a power cable 107. A medium voltage power source may, for example, be a wall socket connected to the mains network. The effect of voltage conversion is notably to raise the temperature of the coil contained in the converter. This source of heat is the source advantageously used in the disclosed embodiment.

The charging device is consequently at least partly contained in the enclosing capsule. The part of the charger contained in the enclosing capsule is the part that is designed to accommodate the charging device.

The converter 106 also comprises, on its upper part, a connector 111 enabling the telephone 102 to be connected to the said converter. In a preferred embodiment of the invention, the telephone 102 is placed directly on the connector 111. In an alternative embodiment, this connector is placed away from the support 105 to which it is connected by a power cable.

FIG. 1 also shows vent holes 109 located on the lower part of the base 105. It is considered here that the lower part of the base 105 is the part located below the converter 106. FIG. 1 shows that the capsule 103 is associated with the base 105 by a fastener located below the vent holes 109.

The base 105 contains vent holes 110 located above the vent holes 109 inside the capsule 103. The holes 110 are preferably located close to the base of the telephone 102 when the latter is placed on the said base 105. The holes 110 may also be deployed over the whole of the area of base 105 located inside the capsule 103. The holes 110 thus act as thermal dissipators.

When a telephone is placed on the base 105, the converter 106 produces heat which warms the air contained around the base 105 and ultimately inside the capsule 103. This warm air, that is at a temperature higher than room temperature (inside the enclosing capsule, the base 105 and consequently around the equipment), then escapes through the vent holes 110, thus raising the temperature inside the capsule 103 and causing a flow of air along the telephone 102. The warm air escaping through the vent holes 110 is replaced by air at room temperature (from outside the enclosing capsule) entering via the vent holes 109.

In the preferred embodiment of the invention described, the vent holes are arranged to enable the circulation of the heat energy released by the converter 106 and conveyed by the air flow inside the device. This circulation occurs from the bottom to the top of the capsule 103. The invention thus makes use of the phenomenon of natural thermal convection that is the upward circulation of air masses when these masses encounter sources of heat in an enclosed environment.

The upper part of the capsule 103 contains vent holes 114 enabling warm air to leave the capsule. In the preferred embodiment of the invention, the area of the vent holes enabling the air to leave the capsule 103 is smaller than the area of the vent holes enabling the air to enter the capsule 103. This has the effect of maintaining a high temperature in the capsule, this temperature being higher than room temperature. Maintaining a high temperature in the capsule favors the absorption of humidity because of the warm air circulating in the capsule.

For this purpose, the enclosing capsule is made of a material with recognized isothermal properties. This material will preferably but not necessarily be transparent to enable a user to read the information displayed on the screen of the telephone 102. This information includes notably the state-of-charge of the battery of the telephone 102.

The materials used will be heatproof with recognized isothermal properties such as, for example, polyvinyl, polycarbonate, or PVC (polyvinylchloride) used in a single thick layer or two thin layers separated by air or any other insulating material (polyurethane foam, aluminum foil, polycarbonate etc.), or a combination of at least two of the above-mentioned materials (inner/outer face or in a 1/2/1 or 2/1/2 "sandwich" form). These materials have the particular quality of being transparent, or at least translucent, in addition to having isothermal properties and also exhibiting excellent resistance to thermal deformation. One or several of these materials will therefore be advantageously used for the present application.

Insofar as the phenomena of turbulence and local variations in the density of the air linked to the way fluids circulate from the lower to the upper vent holes are recognized in the background art, it is useful, in an alternative embodiment of the invention, to endow the inner walls of the capsule with characteristics whereby the walls reflect the received heat, guaranteeing the stability of the temperature and consequently a homogeneous air density in the enclosing capsule and thus an optimal upward air flow.

This reflective property is either intrinsic to the material used to make the capsule or procured by applying a layer of ad hoc material on the inner walls of the capsule 103.

FIG. 1 shows that the capsule 103 has two rigid parts. One lower part 112 fixed to the base 105 and another removable part 113. In an alternative embodiment of the invention, the parts 112 and 113 are in contact when the capsule is closed, via a seal ensuring the tightness of the parts 112 and 113.

The mobility between the parts 112 and 113 is obtained, in a first example, through two mechanically distinct parts, like a lid on a recipient.

In another example, the mobility between the parts 112 and 113 is obtained through an articulation, a hinge 115 for example, enabling the part 113 to swing open relative to the part 112. The opening of the part 113 enables the telephone 102 to be placed on the base 105. The relative mobility of the parts 112 and 113 enables an opening to be created in the capsule 103.

Once the enclosing capsule has been closed, the telephone 102 having already been positioned on the connector 111, the converter 106 releases heat energy as a result of the heating of its components. The resulting heat energy is distributed naturally towards the vent holes 114, via the vent holes 110 by a thermal convection effect.

Air at room temperature enters the capsule 103 via the vent holes 109 to be heated and circulated in the capsule 103. This convection of warm air favors the evaporation of the water molecules formed on the circuits and/or components in the telephone 102. The device as set forth in the invention enables the water molecules contained in the telephone 102 to be forced to break all contact with the electronic components forming part of the telephone 102. These water molecules are then evacuated by the thermal convection created by the confinement and the heat energy released by the converter 106.

The normal charging cycles of the telephone 102 enable the water molecules to be eliminated regularly and thus prevents the phenomenon of oxidation caused by the slow reaction between the water molecules and the circuits or metallic parts contained in the telephone 102.

In an alternative embodiment, the walls of capsule 103 are made of a flexible material forming a pocket. In this case the upper part of this pocket contains a rigid disk in which the vent holes 114 are made. The device is opened and closed by a mechanism of the same type that is used for food freezer bags. The positioning of the vent holes 114 at the top of the device is obtained by the telephone 102 itself which thus supports the disk in which the said vent holes have been made.

In this alternative embodiment, the use of a rigid disk is optional. In this case, the vent holes for evacuating the air are orifices with reinforced edges made in the flexible membrane.

In this flexible embodiment, the capsule can be made rigid by inflatable or removable curved ribs. When these ribs are inflated with air or assembled, they form a rigid armature for the different parts of the capsule.

This rigidity can also be obtained by the implementation of a membrane with two walls between which air is injected.

There are many possible embodiments of the capsule.

The invention claimed is:

1. A dehumidifying device for an item of rechargeable electronic equipment wherein:
    a charger capable of accommodating the rechargeable electronic equipment to ensure that the said rechargeable electronic equipment can be recharged,
    an enclosing capsule fixed to the charger,
    an opening system for the enclosing capsule enabling the installation of the rechargeable electronic equipment connected to the charger by a connection device,
    vent holes on the upper part of the enclosing capsule enabling the warm air to leave the enclosing capsule,
    vent holes on the lower part of the enclosing capsule or the charger, the latter acting as a base for the equipment, enabling the air from outside to enter and circulate in the enclosing capsule.

2. The device as set forth in claim 1, wherein the area of the vent holes on the upper part of the enclosing capsule is smaller than the area of the vent holes on the lower part of the enclosing capsule or the charger.

3. The device as set forth in claim 1, wherein the enclosing capsule is made of a heatproof material with isothermal properties.

4. The device as set forth in claim 1, wherein the enclosing capsule is translucent, enabling a user to see the mobile electronic equipment inserted in the said device.

5. The device as set forth in claim 2, wherein the enclosing capsule is rigid.

6. The device as set forth in claim 2, wherein the enclosing capsule is made of a flexible material forming at least one flexible membrane, the rigidity of the device being obtained by curved ribs or by the injection of air between the membranes of the capsule.

7. The device as set forth in claim 1, wherein the device as a whole is hermetic once the rechargeable electronic equipment is placed inside for the recharge/dehumidification sequence.

8. The device as set forth in claim 1, wherein the charger has a connector enabling a connection to an item of rechargeable electronic equipment.

* * * * *